US006734693B2

(12) United States Patent
Nakayama

(10) Patent No.: US 6,734,693 B2
(45) Date of Patent: May 11, 2004

(54) SEMICONDUCTOR INTEGRATED CIRCUIT HAVING A SEMICONDUCTOR STORAGE CIRCUIT AND A TEST CIRCUIT FOR TESTING THE SEMICONDUCTOR STORAGE CIRCUIT

(75) Inventor: Atsushi Nakayama, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/294,788

(22) Filed: Nov. 15, 2002

(65) Prior Publication Data

US 2004/0051548 A1 Mar. 18, 2004

(30) Foreign Application Priority Data

Sep. 17, 2002 (JP) ....................................... 2002-270496

(51) Int. Cl.[7] ................................................ G01R 31/02
(52) U.S. Cl. ..................................... 324/763; 324/158.1
(58) Field of Search ................................ 324/763, 765, 324/73.1; 371/22.3, 22.6; 438/14, 17, 18; 257/48; 365/201

(56) References Cited

U.S. PATENT DOCUMENTS 4,598,401 A * 7/1986 Whelan ...................... 714/732
5,175,494 A * 12/1992 Yoshimori .................. 714/728
5,570,035 A * 10/1996 Dukes et al. ............... 324/763

FOREIGN PATENT DOCUMENTS

JP 2002-190527 7/2002

* cited by examiner

*Primary Examiner*—Kamand Cuneo
*Assistant Examiner*—Tung X. Nguyen
(74) *Attorney, Agent, or Firm*—Oblon, Spivak, McClelland, Maier & Neustadt, P.C.

(57) ABSTRACT

A first test circuit is supplied with test signals to test an operation of a first semiconductor storage circuit. The test signals include a test input signal, a test output signal, and a test sync signal. A second test circuit receives the test signals from the first test circuit to test an operation of a second semiconductor storage circuit. The first test circuit uses the test input signal as information to operate the first semiconductor storage circuit in synchronization with the test sync signal and supplies the test input signal to the second test circuit. The first test circuit also synchronizes a signal, which is determined by performing a logical operation between the output of the first semiconductor storage circuit and the test output signal supplied thereto, with the test sync signal and supplies the signal to the second test circuit as a test output signal.

21 Claims, 7 Drawing Sheets

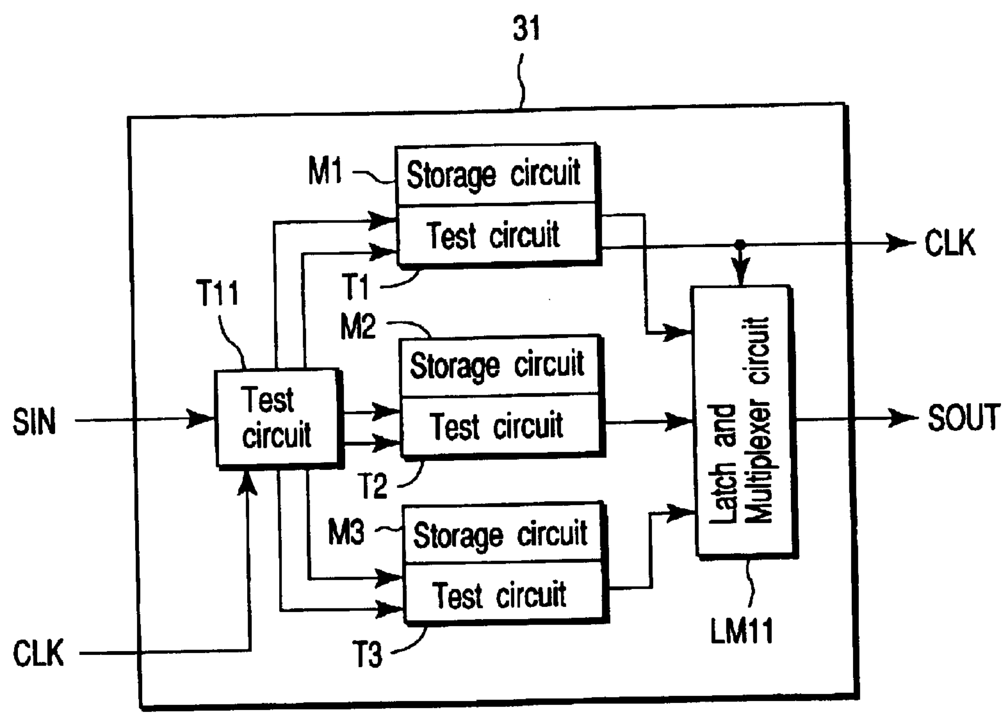
F I G. 8
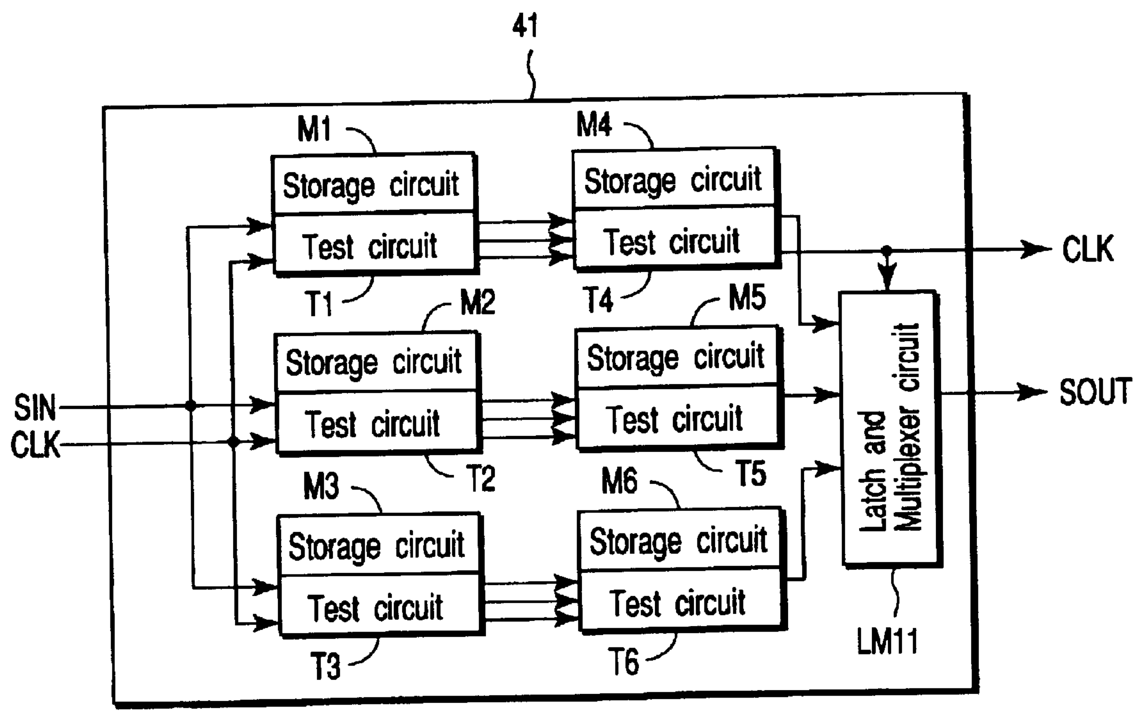
F I G. 9

SEMICONDUCTOR INTEGRATED CIRCUIT HAVING A SEMICONDUCTOR STORAGE CIRCUIT AND A TEST CIRCUIT FOR TESTING THE SEMICONDUCTOR STORAGE CIRCUIT

CROSS-REFERENCE TO RELATED APPLICATIONS

This application is based upon and claims the benefit of priority from the prior Japanese Patent Application No. 2002-270496, filed Sep. 17, 2002, the entire contents of which are incorporated herein by reference.

BACKGROUND OF THE INVENTION

1. Field of the Invention

The present invention relates to a semiconductor integrated circuit having a semiconductor storage circuit that operates at high speed and a test circuit for testing the semiconductor storage circuit.

2. Description of the Related Art

A prior art integrated circuit includes a plurality of semiconductor storage circuits and a test circuit for checking whether the semiconductor storage circuits normally operate or not. The test circuit is generally connected in parallel to a test signal line to which a test signal is input.

FIG. 1 is a block diagram showing an arrangement of storage circuits, test circuits and test signal lines in a prior art semiconductor integrated circuit 101.

Storage circuits M101, M102 and M103 are memories such as a DRAM. Test circuits T101, T102 and T103 are interface circuits for testing the storage circuits. The test circuits receive a test input signal SIN and a clock signal CLK and output test output signals SOUT. A latch and multiplexer circuit LM101 selects one from the test output signals output from the test circuits T101, T102 and T103 and outputs the selected one to the outside. The test signal lines are lines through which the test input signal SIN, test output signal SOUT and clock signal CLK flow. The test input signal SIN includes, for example, an address signal, a command, and write data. The test output signals OUT include, for example, read data. The clock signal CLK is a sync signal for controlling a test operation. In the semiconductor integrated circuit 101 so arranged, the storage circuits M101, M102 and M103 operate independently in response to the externally supplied clock signal CLK.

FIG. 2 is a block diagram of the test circuit T101 of the semiconductor integrated circuit 101 shown in FIG. 1.

A test input signal SIN including an address, a command and write data is input to the test circuit T101. The test input signal SIN is latched in a latch circuit 102 in synchronization with the clock signal CLK that is a test sync signal. The latched test input signal SIN is decoded by a decoder 103 and supplied to the storage circuit M101 to be tested. The test output signals of the storage circuit M101 are decreased in number by multiplexers 104 and 105 serving as selection circuits and then supplied as test output signals SOUT outside the semiconductor integrated circuit 101 in synchronization with the clock signal CLK.

However, the foregoing prior art semiconductor integrated circuit requires a new technique against the following two problems.

The first problem is that demands for the design of test signal lines greatly increase. This problem stems from a rise in the degree of difficulty in high-speed test. This rise is due to microfabrication of wiring, a drop in logic voltage, an increase in wiring density, an increase in size and area of integrated circuits, a rise in operating frequency, etc. The test signal lines therefore need to be designed with little influence of other lines due to variations in wiring delay, crosstalk, and the like. In view of the design for an SOC (system on chip), the priority of wiring for signals that do not affect the performance of an integrated circuit, such as test signals, is very low; therefore, the test signal lines should be designed as easily as possible.

The second problem is a rise in unit price for tests. This problem stems from a long period of time required for a test and a rise in unit price for test systems due to high performance of integrated circuits in recent times. Recent integrated circuits having a plurality of storage circuits are therefore required to test these storage circuits at once.

To test the storage circuits at once is however very difficult since the operating frequency of an integrated circuit has recently become as short as a delay in signal. In other words, amounts of delay in test signals need to coincide with one another between test signal input terminals or test signal generation circuits and test circuits of all storage circuits.

BRIEF SUMMARY OF THE INVENTION

A semiconductor integrated circuit according to an aspect of the present invention, comprises first and second semiconductor storage circuits which store information, a first test circuit which is supplied with test signals to test an operation of the first semiconductor storage circuit, the test signals including a test input signal, a test output signal, and a test sync signal used for synchronization with a test operation, and a second test circuit which is connected to a stage subsequent to the first test circuit, the second test circuit receiving the test signals from the first test circuit to test an operation of the second semiconductor storage circuit. The first test circuit uses the test input signal as information to operate the first semiconductor storage circuit in synchronization with the test sync signal and supplies the test input signal to the second test circuit in a next stage. The first test circuit also synchronizes a signal, which is determined by performing a logical operation between an output of the first semiconductor storage circuit and the test output signal supplied thereto, with the test sync signal and supplies the signal to the second test circuit as a test output signal.

BRIEF DESCRIPTION OF THE SEVERAL VIEWS OF THE DRAWING

FIG. 8 is a block diagram showing an arrangement of a semiconductor integrated circuit according to a second embodiment of the present invention;

FIG. 9 is a block diagram showing an arrangement of a semiconductor integrated circuit according to a third embodiment of the present invention;

DETAILED DESCRIPTION OF THE INVENTION

Figure 1:
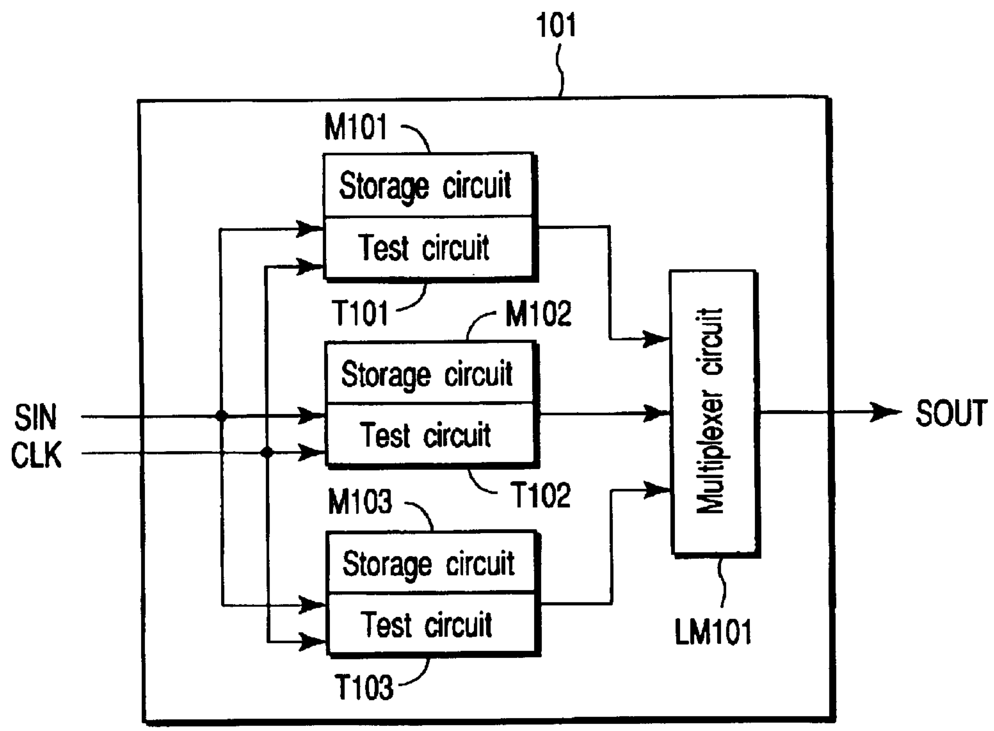
FIG. 1 is a block diagram showing an arrangement of storage circuits, test circuits and test signal lines in a prior art semiconductor integrated circuit.
Figure 2:
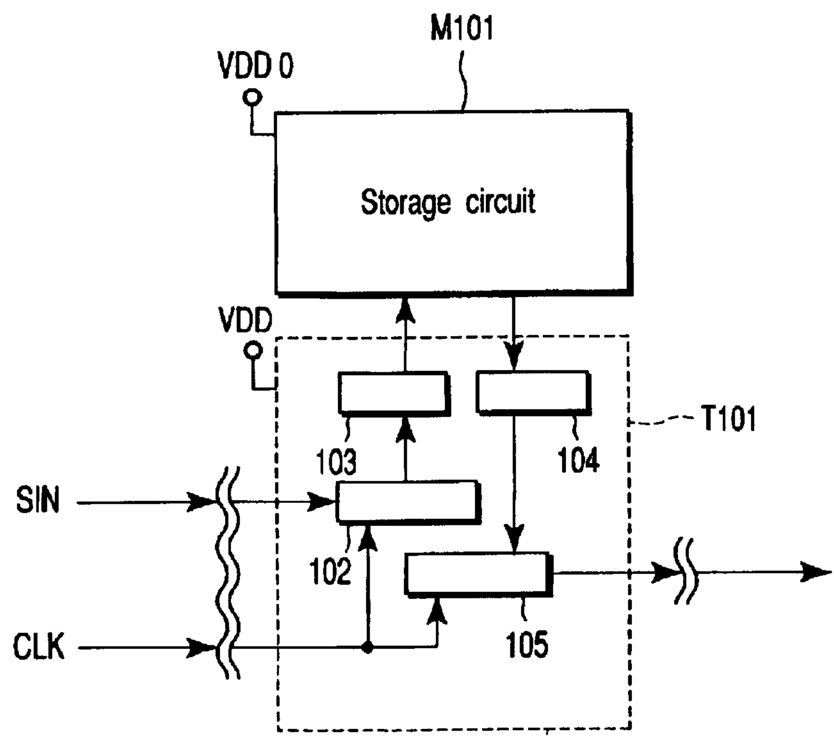
FIG. 2 is a block diagram of one of the test circuits in the prior art semiconductor integrated circuit shown in FIG. 1.

Semiconductor integrated circuits each having storage circuits and logic circuits according to the embodiments of the present invention will now be described with reference to the accompanying drawings. The same components are denoted by the same reference numerals throughout the drawings.

First Embodiment

First, a semiconductor integrated circuit according to a first embodiment of the present invention will be described. The semiconductor integrated circuit is a hybrid system LSI of storage and logic circuits. The system LSI includes pairs of storage and test circuits and a CPU serving as a logic circuit. The storage circuits are each composed of a semiconductor memory such as a DRAM, an SRAM and a programmable ROM, a ferroelectric memory, or the like. The test circuits are each composed of, e.g., an interface circuit for testing an operation of each of the storage circuits.

Figure 3:
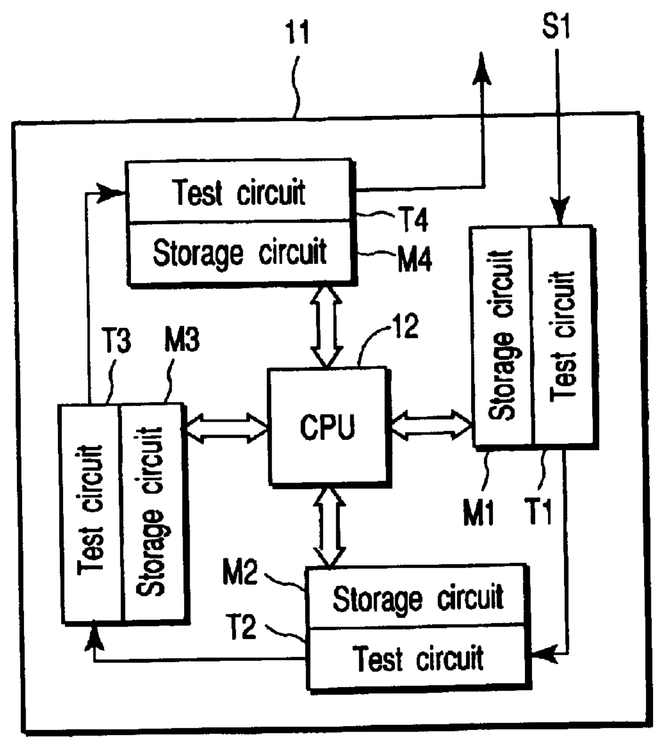
FIG. 3 is a block diagram showing an arrangement of a semiconductor integrated circuit according to a first embodiment of the present invention.

FIG. 3 is a block diagram showing an arrangement of the semiconductor integrated circuit according to the first embodiment.

As shown in FIG. 3, a semiconductor integrated circuit 11 includes storage circuits M1 to M4, test circuits T1 to T4, and a CPU 12. The storage circuits and their respective test circuits are arranged close to each other. The storage circuit M1 and test circuit T1, storage circuit M2 and test circuit T2, storage circuit M3 and test circuit T3, and storage circuit M4 and test circuit T4 each make up a pair of circuits.

The test circuits T1 to T4 are connected in series to a test signal line through which test signal S1 is externally supplied. More specifically, the test signal S1 is input to the test circuit T1 from outside. The test circuit T1 is connected to the storage circuit M1 and the test circuit T2. The test circuit T2 is connected to the storage circuit M2 and the test circuit T3. The test circuit T3 is connected to the storage circuit M3 and the test circuit T4. The test circuit T4 is connected to the storage circuit M4 and its output signal is supplied to the outside of the semiconductor integrated circuit 11.

The test signal S1 includes a test input signal, a test output signal, and a clock signal. The test input signal includes an address signal, a command, and write data. The address signal is a signal indicating a memory location of a storage circuit. The command is a signal for instructing a storage circuit to perform an operation such as a write operation and a read operation. The write data is data written to a memory location of a storage circuit that is defined by an address signal. The test output signal includes data indicating test results of a storage circuit, such as read data from the storage circuit. The clock signal is a sync signal for controlling a test operation of a test circuit.

The storage circuits M1 to M4 are each composed of, e.g., a DRAM. The storage circuits M1 to M4 store data in response to a write command and output the stored data in response to a read command. The test circuits T1 to T4 are interface circuits for testing the storage circuits M1 to M4 and input/output signals necessary for the test. The CPU 12 controls write and read operations of the storage circuits M1 to M4.

Then, a semiconductor integrated circuit according to a modification to the above first embodiment will be described.

Figure 4:
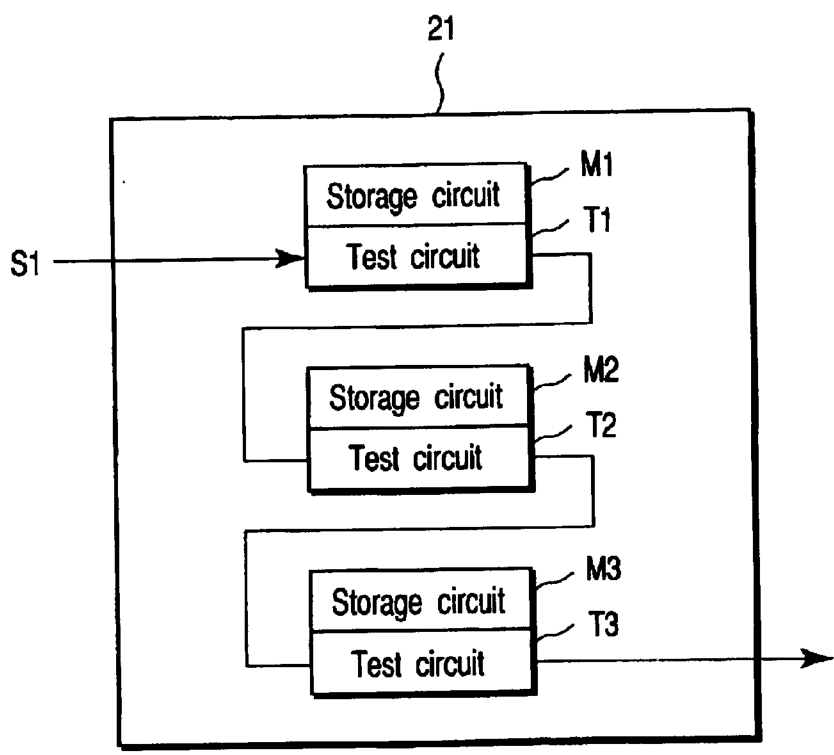
FIG. 4 is a block diagram showing an arrangement of a semiconductor integrated circuit according to a modification to the first embodiment of the present invention.

FIG. 4 is a block diagram showing an arrangement of the semiconductor integrated circuit according to the modification. A logic circuit is omitted from FIG. 4. In the first embodiment, four storage circuits and four test circuits are arranged around the CPU 12. However, three storage circuits and three test circuits can be arranged in a line in the semiconductor integrated circuit as shown in FIG. 4.

Referring to FIG. 4, a semiconductor integrated circuit 21 includes storage circuits M1 to M3 and test circuits T1 to T3. The storage circuits and their respective test circuits are arranged close to each other. The storage circuit M1 and test circuit T1, storage circuit M2 and test circuit T2, and storage circuit M3 and test circuit T3 each make up a pair of circuits.

The test circuits T1 to T3 are connected in series to a test signal line through which a test signal S1 is externally supplied. More specifically, the test signal S1 is input to the test circuit T1 from outside. The test circuit T1 is connected to the storage circuit M1 and the test circuit T2. The test circuit T2 is connected to the storage circuit M2 and the test circuit T3. The test circuit T3 is connected to the storage circuit M3 and its output signal is supplied to the outside of the semiconductor integrated circuit 21.

The storage circuits M1 to M3 are each composed of, e.g., a DRAM. The storage circuits M1 to M3 store data in response to a write command and output the stored data in response to a read command. The test circuits T1 to T3 are interface circuits for testing the storage circuits M1 to M3 and input/output signals necessary for the test. The other components are the same as those of the first embodiment.

For the sake of simplification, the arrangement of the semiconductor integrated circuit shown in FIG. 4, which is simpler than that of the circuit shown in FIG. 3, will be described in detail.

Figure 5:
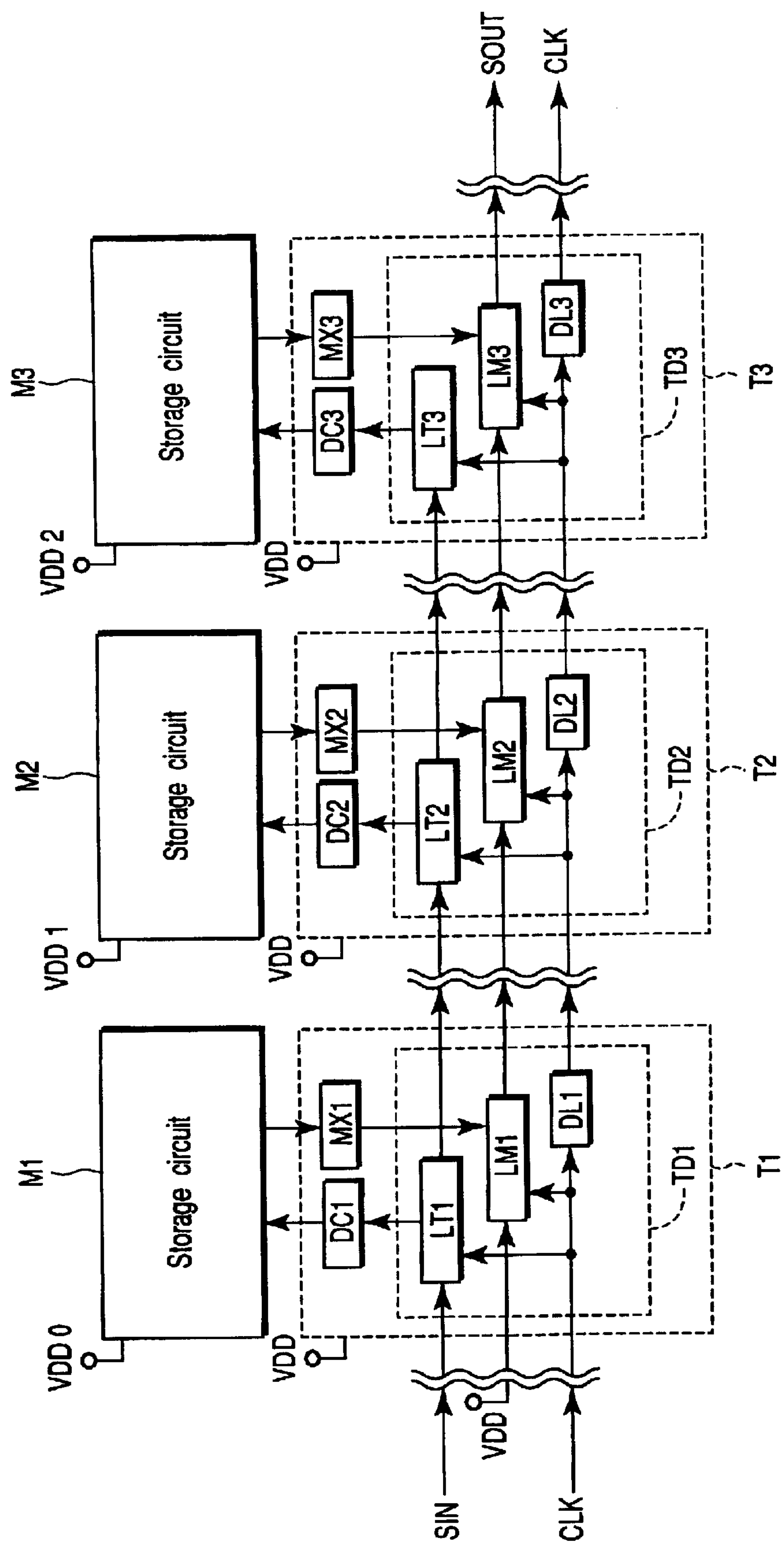
FIG. 5 is a block diagram specifically showing an arrangement of a test circuit in the semiconductor integrated circuit according to the modification to the first embodiment of the present invention.

FIG. 5 is a block diagram specifically showing an arrangement of the chained test circuits in the modification shown in FIG. 4.

The test circuit T1 includes a test signal delay circuit TD1, a decoder DC1, and a multiplexer MX1. The test circuit T2 includes a test signal delay circuit TD2, a decoder DC2, and a multiplexer MX2. The test circuit T3 includes a test signal delay circuit TD3, a decoder DC3, and a multiplexer MX3.

The test signal delay circuit TD1 includes a latch circuit LT1, a latch and multiplexer circuit LM1, and a delay circuit DL1. The test signal delay circuit TD2 includes a latch circuit LT2, a latch and multiplexer circuit LM2, and a delay circuit DL2. The test signal delay circuit TD3 includes a latch circuit LT3, a latch and multiplexer circuit LM3, and a delay circuit DL3.

As shown in FIG. 5, the latch circuit LT1 of the test signal delay circuit TD1 is supplied with a test input signal SIN such as an address signal, a command, and write data. The latch circuit LT1 is connected to the storage circuit M1 through the decoder DC1. The latch circuit LT1 is also connected to the latch circuit LT2 of the test signal delay circuit TD2 in the next stage.

The storage circuit M1 is connected to the latch and multiplexer circuit LM1 through the multiplexer MX1. The latch and multiplexer circuit LM1 is connected to the latch and multiplexer circuit LM2 of the test signal delay circuit TD2 in the next stage. The delay circuit DL1 is connected to the delay circuit DL2 of the test signal delay circuit TD2 in the next stage.

The latch circuit LT2 of the test signal delay circuit TD2 is connected to the storage circuit M2 through the decoder DC2. The latch circuit LT2 is also connected to the latch circuit LT3 of the test signal delay circuit TD3 in the next stage. The storage circuit M2 is connected to the latch and multiplexer circuit LM2 through the multiplexer MX2. The latch and multiplexer circuit LM2 is connected to the latch and multiplexer circuit LM3 of the test signal delay circuit TD3 in the next stage. The delay circuit DL2 is connected to the delay circuit DL3 of the test signal delay circuit TD3 in the next stage.

The latch circuit LT3 of the test signal delay circuit TD3 is connected to the storage circuit M3 through the decoder DC3. The storage circuit M3 is connected to the latch and multiplexer circuit LM3 through the multiplexer MX3. The latch and multiplexer circuit LM3 outputs read data as a test output signal. The delay circuit DL3 outputs a clock signal CLK.

An operation of the semiconductor integrated circuit shown in FIG. 5 will now be described.

A test input signal SIN is input to the latch circuit LT1 of the test circuit T1 from outside. The latch circuit LT1 is supplied with a clock signal CLK that is a clock sync signal. The test input signal SIN is synchronized with the clock signal CLK and latched in the latch circuit LT1. Concurrently with the latch operation, the test input signal SIN is supplied to the latch circuit LT2 of the test circuit T2 in the next stage.

The test input signal SIN latched in the latch circuit LT1 is decoded by the decoder DC1 and the decoded signal is supplied to the storage circuit M1 to be tested. The storage circuit outputs an output signal. An output that is determined by logic between the test output signal supplied from the preceding stage and the output signal supplied from the storage circuit in the present stage, is synchronized with a test sync signal and sent to the test circuit in the next stage as a test output signal.

The operation of the semiconductor integrated circuit shown in FIG. 5 will be described more specifically.

At least one of an address signal, a command, and write data is input to the latch circuit LT1 as the test input signal SIN. The clock signal CLK is input to the latch circuit LT1, latch and multiplexer circuit LM1, and delay circuit DL1 as a sync signal for testing. The test input signal SIN input to the latch circuit LT1 is synchronized with the clock signal CLK and latched in the latch circuit LT1. Then, the test input signal SIN is decoded by the decoder DC1 and the decoded signal is supplied to the storage circuit M1 to be tested. As described above, the address signal is a signal indicating a memory location of a storage circuit. The command is a signal for instructing a storage circuit to perform an operation such as a write operation and a read operation. The write data is data written to a memory location of a storage circuit that is defined by an address signal.

Figure 6:
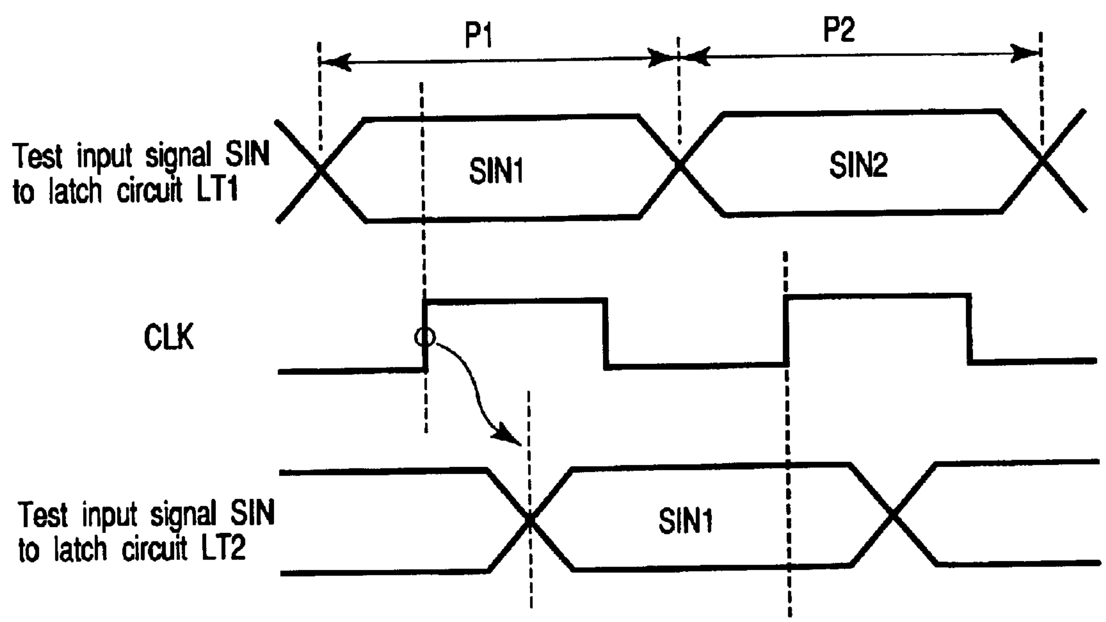
FIG. 6 is a timing chart showing an operation of the semiconductor integrated circuit according to the modification to the first embodiment of the present invention.

FIG. 6 is a timing chart showing an operation of the semiconductor integrated circuit.

Referring to FIG. 6, a first test input signal SIN1 is input to the latch circuit LT1 of the test circuit T1 during a time period P1. When a clock signal CLK rises during the time period P1, the test input signal SIN1 is latched in the latch circuit LT1 and the storage circuit M1 operates. In other words, data is written to or read from the storage circuit M1. After that, write verify data or read data read out of the storage circuit M1 is supplied to the latch and multiplexer circuit LM1 through the multiplexer MX1. The circuit LM1 synchronizes a signal, which is determined by logic between the write verify data or read data and a previously-input signal, namely, "H" (power supply voltage VDD), with the clock signal CLK and supplies it to the test circuit T2 in the next stage as a test output signal.

The test input signal SIN1 is supplied to the latch circuit LT2 of the test circuit T2 in synchronization with the latch operation of the test input signal SIN1 in the latch circuit LT1. If the clock signal CLK rises while the test input signal SIN1 is input to the latch circuit LT2, the test input signal SIN1 is latched in the latch circuit LT2 and the storage circuit M2 operates. In other words, data is written to or read from the storage circuit M2. After that, write verify data or read data read out of the storage circuit M2 is supplied to the latch and multiplexer circuit LM2 through the multiplexer MX2. The circuit LM2 synchronizes a signal, which is determined by logic between the write verify data or read data and the test output signal output from the test circuit T1 in the preceding stage, with the clock signal CLK and supplies it to the test circuit T3 in the next stage as a test output signal.

Similarly, the test input signal SIN1 is supplied to the latch circuit LT3 of the test circuit T3 in synchronization with the latch operation of the test input signal SIN1 in the latch circuit LT2. If the clock signal CLK rises while the test input signal SIN1 is input to the latch circuit LT3, the test input signal SIN1 is latched in the latch circuit LT3 and the storage circuit M3 operates. In other words, data is written to or read from the storage circuit M3. After that, write verify data or read data read out of the storage circuit M3 is supplied to the latch and multiplexer circuit LM3 through the multiplexer MX3. The circuit LM3 synchronizes a signal, which is determined by logic between the write verify data or read data and the test output signal output from the test circuit T2 in the preceding stage, with the clock signal CLK and outputs it as a test output signal SOUT.

The clock signal CLK is, as described above, used as a sync signal for latching a test input signal in a test circuit in each stage. The clock signal CLK is delayed by each of the delay circuits DL1, DL2 and DL3 and then supplied to a test circuit in the next stage as a sync signal.

Usually, the location of DRAM macro (DRAMs and test circuits) in a semiconductor integrated circuit depends upon a requirement other than that for designing test signal lines. As components necessary for composing a storage circuit and determining the test signal lines, there are an input/output terminal for test signals, a test signal generation circuit, a pass/fail determination circuit, and the like in the semiconductor integrated circuit. No matter how these components may be arranged, a test signal having a lower priority on the design for test signal lines is required to allow a high-speed test to be conducted without fail.

Figure 7:
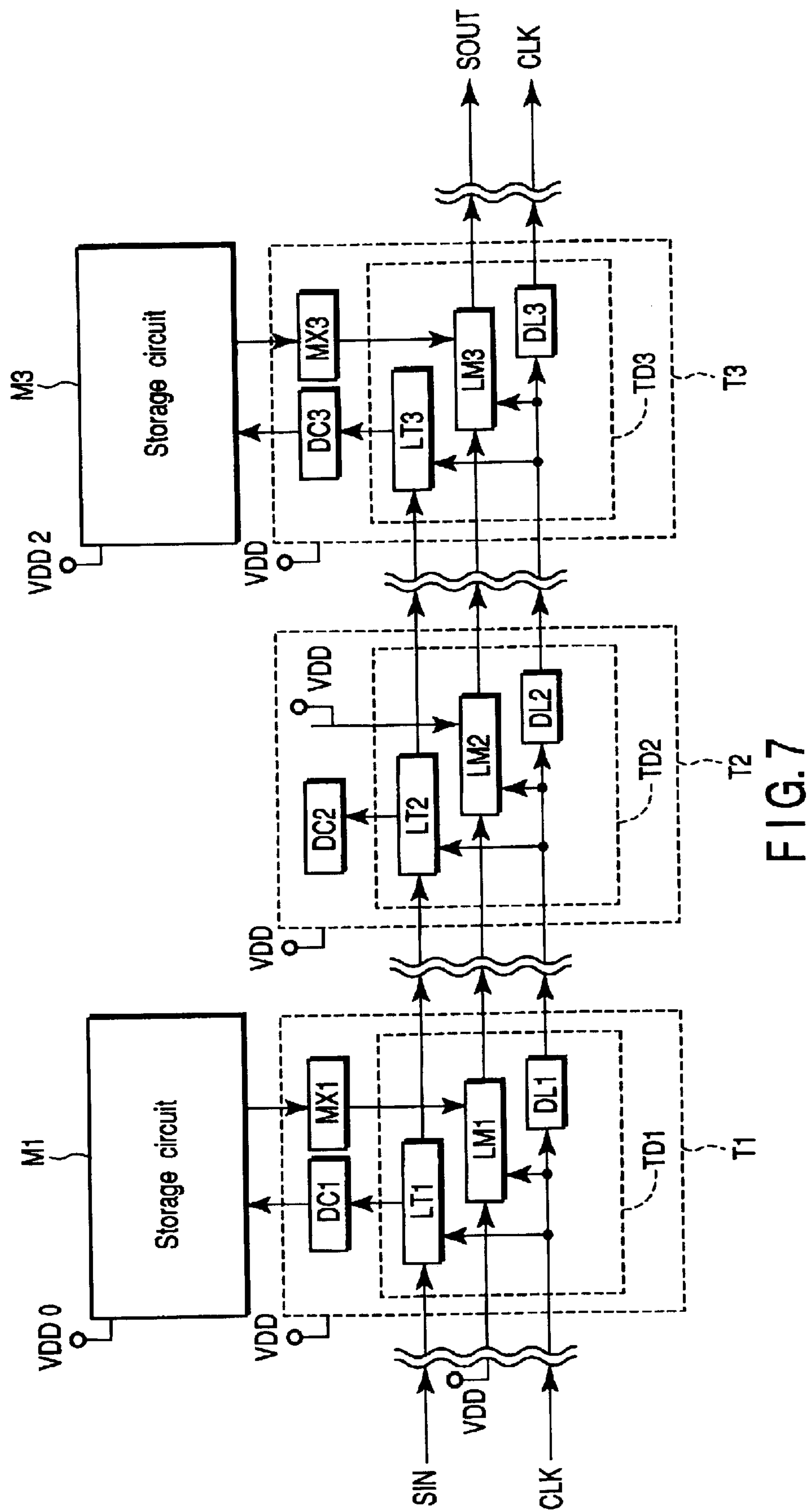
FIG. 7 is a block diagram showing an example of the semiconductor integrated circuit according to the modification to the first embodiment, in which a test circuit having no storage circuit is inserted between storage circuits.

If, however, two DRAMs (storage circuits M1 and M2) are separated from each other, a test signal line between the DRAMs is difficult to design so as to meet the requirements. To cope with such a difficulty, in the above embodiment, a latch circuit is provided in each of the test circuits to latch a test signal output from the DRAMs and output the latched signal to the DRAMs. If the two DRAMs are separated further, a dummy test circuit including a test signal delay circuit can be inserted. FIG. 7 shows an example in which a test circuit having no DRAM is inserted between DRAMs that are separated from each other.

While the clock signal CLK serving as a test sync signal is used as a sync signal for latching another test signal as described above, it is delayed by a delay circuit and then output to a test circuit in the next stage as a sync signal.

In a synchronous circuit, it is generally preferable to transmit a sync signal in a direction opposite to that of another signal because the transmission of the signal can be stabilized. If a test signal is delayed greater than a test sync signal, incorrect information will be fetched when the test signal is latched in response to the test sync signal. In the first embodiment, however, the test sync signal is transmitted in the same direction as that of another test signal on purpose. In this case, an amount of delay in the test sync signal needs to be larger than that of delay in the test signal between the test circuits. A delay circuit is therefore inserted in a line for the test sync signal.

The test circuits have each individual identifier. Using a test command including the identifier, an amount of delay in test sync signal can be controlled from outside for each delay circuit. If, moreover, a test sync signal is supplied to the outside of the integrated circuit from the test circuit in the final stage of the integrated circuit, an amount of delay in the test sync signal in a delay circuit in the test circuit in the final stage can be determined by actual measurement.

Power supplies (VDD0, VDD1 and VDD2 in FIG. 5) are provided for the storage circuits T1, T2 and T3, respectively. This is disadvantageous in terms of the reinforcement of power lines but has the advantage that the current consumption of each of the storage circuits can be measured. The test circuits have to operate even though their respective storage circuits do not turn on irrespective of whether the power supplies of the storage circuits are the same or different from each other. For this reason, power supplies VDD other than those of the storage circuits are provided. The use of different power supplies between a storage circuit and a test circuit for the memory is disclosed in Japanese Patent Application KOKAI Publication No. 2002-190527.

In the first embodiment and its modification described above, a plurality of test circuits each have a latch circuit for latching a test signal and are connected in series to the test signal lines, with the result that the test signal lines can easily be designed without considering a delay in test signal. Consequently, great constraints are not added to the arrangement of storage circuits to be tested. Furthermore, a plurality of storage circuits can be tested at the same time, so that the unit price of a test can be inhibited from increasing.

Second Embodiment

FIG. 8 is a block diagram showing an arrangement of a semiconductor integrated circuit according to a second embodiment of the present invention. A logic circuit is omitted from FIG. 8.

As shown in FIG. 8, a semiconductor integrated circuit 31 includes storage circuits M1 to M3 and test circuits T1 to T3 and T11. The storage circuits and their respective test circuits are arranged close to each other. The storage circuit M1 and test circuit T1, storage circuit M2 and test circuit T2, and storage circuit M3 and test circuit T3 each make up a pair of circuits.

The test circuits T1 to T3 are connected in parallel to lines to which a test input signal SIN and a clock signal CLK are output from the test circuit T11. More specifically, the test input signal SIN and clock signal CLK are input to the test circuit T11 from outside. The test circuits T1 to T3 are connected in parallel to the test circuit T11. The test circuits T1 to T3 are also connected to storage circuits M1 to M3, respectively and to a latch and multiplexer circuit LM11.

An operation of the semiconductor integrated circuit according to the second embodiment will now be described.

A test input signal SIN and a clock signal CLK are input to the test circuit T11 from outside. The test input signal SIN input to the test circuit T11 is latched in the test circuit T11 and supplied to each of the test circuits T1 to T3 in synchronization with-the clock signal CLK serving as a test synch signal.

The test input signal SIN supplied to each of the test circuits T1 to T3 is latched in a latch circuit of each of the test circuits T1 to T3 in synchronization with the clock signal CLK. The latched test input signal is decoded by a decoder and output to each of the storage circuits M1 to M3 to be tested.

After that, an output that is determined by logic between a preset test output signal and a test output signal read out of each of the storage circuits M1 to M3 is synchronized with the clock signal CLK and supplied from each of the test circuits T1 to T3 to the latch and multiplexer circuit LM11 as a test output signal. The circuit LM11 selects one of test output signals of the test circuits T1 to T3 and supplies the selected one to the outside.

In the second embodiment described above, a plurality of test circuits each have a latch circuit for latching a test signal and are connected in parallel to the test signal lines, and another test circuit is provided in a stage precedent to these test circuits. Thus, the test signal lines can easily be designed without considering a delay in test input signal. Consequently, great constraints are not added to the arrangement of storage circuits to be tested. Furthermore, a plurality of storage circuits can be tested at the same time, so that the unit price of a test can be inhibited from increasing.

Third Embodiment

FIG. 9 is a block diagram showing an arrangement of a semiconductor integrated circuit according to a third embodiment of the present invention. A logic circuit is omitted from FIG. 9.

Referring to FIG. 9, a semiconductor integrated circuit 41 includes storage circuits M1 to M6, test circuits T1 to T6, and a latch and multiplexer circuit LM11. The storage circuits and their respective test circuits are arranged close to each other. The storage circuit M1 and test circuit T1, storage circuit M2 and test circuit T2, storage circuit M3 and test circuit T3, storage circuit M4 and test circuit T4, storage circuit M5 and test circuit T5, and storage circuit M6 and test circuit T6 each make up a pair of circuits.

The test circuits T1 to T3 are connected in parallel to lines to which a test input signal SIN and a clock signal CLK are supplied from outside. More specifically, the test input signal SIN and clock signal CLK are input to each of the test circuits T1 to T3. The test circuits T1 to T3 are connected to the storage circuits M1 to M3, respectively and to the test circuits T4 to T6 in the next stage. The test circuits T4 to T6 are connected to the storage circuits M4 to M6, respectively and to the latch and multiplexer circuit LM11.

An operation of the semiconductor integrated circuit according to the third embodiment will now be described.

A test input signal SIN and a clock signal CLK are input to each of the test circuits T1 to. T3 from outside. Then, the test input signal SIN is latched in a latch circuit provided in each of the test circuits T1 to T3 in synchronization with the clock signal CLK. The test input signal latched in each of the test circuits T1 to T3 is decoded by a decoder and supplied to each of the storage circuits M1 to M3 to be tested.

After that, data output from each of the storage circuits M1 to M3 is input to the test circuits T1 to T3. The test circuits T1 to T3 synchronize a signal, which is determined by logic between the data read out of each of the storage circuits M1 to M3 and a preset test output signal, with the clock signal CLK and output it to the test circuits T4 to T6 in the next stage as a test output signal.

The test input signal SIN is latched in the latch circuit of each of the test circuits T1 to T3 and simultaneously it is synchronized with the clock signal CLK and output to each of the test circuits T4 to T6 in the next stage. Then, the test input signal SIN is synchronized with the clock signal CLK and latched in the latch circuit of each of the test circuits T4 to T6. The latched test input signal is decoded by a decoder and output to each of the storage circuits M4 to M6 to be tested.

After that, the data output from each of the storage circuits M4 to M6 is input to the test circuits T4 to T6, respectively. The test circuits T4 to T6 synchronize a signal, which is determined by logic between the data read out of each of the storage circuits M4 to M6 and the test output signal output from each of the test circuits T1 to T3 in the preceding stage, with the clock signal CLK and output it to the latch and multiplexer circuit LM11. The latch and multiplexer circuit LM11 selects one of test output signals supplied from the test circuits T4 to T6 and outputs the selected one to the outside of the semiconductor integrated circuit 41 as an output signal SOUT.

In the third embodiment described above, a plurality of test circuits each have a latch circuit for latching a test signal and are connected in parallel to the test signal lines, and another test circuit is provided in a stage subsequent to these test circuits. Therefore, the test signal lines can easily be designed without considering a delay in test signal. Consequently, great constraints are not added to the arrangement of storage circuits to be tested. Furthermore, a plurality of storage circuits can be tested at the same time, so that the unit price of a test can be inhibited from increasing.

Figure 10:
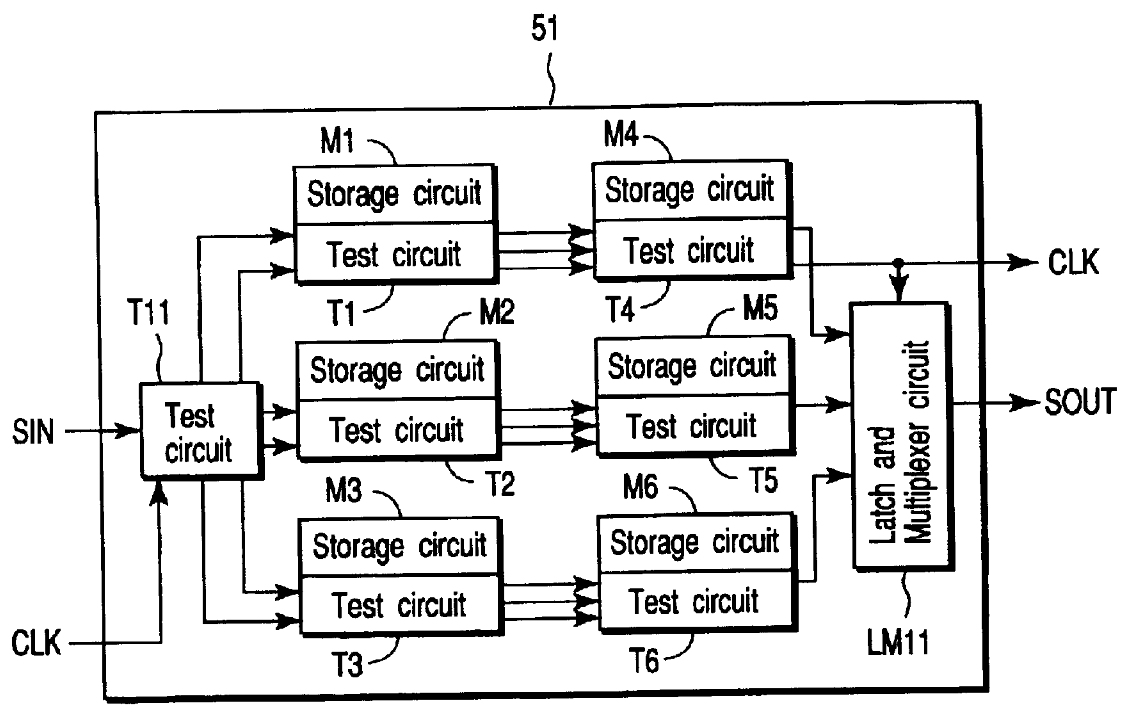
FIG. 10 is a block diagram showing an arrangement of a semiconductor integrated circuit according to a modification to the third embodiment of the present invention.

A semiconductor integrated circuit according to a modification to the third embodiment will now be described. FIG. 10 is a block diagram showing an arrangement of the semiconductor integrated circuit according to the modification. A logic circuit is omitted from FIG. 10.

In the third embodiment described above, test signals are directly supplied from outside to the test circuits T1 to T3 that are connected in parallel to each other. In the modification, however, a test circuit T11 is inserted in the stage precedent to the test circuits T1 to T3 to which a test signal is input. More specifically, the test input signal SIN and clock signal CLK are supplied to the test circuit T11. The test circuits T1 to T3 are connected in parallel to the test circuit T11, and an output of the test circuit T11 is supplied to each of the test circuits T1, T2 and T3. The other components are the same as those of the third embodiment.

An operation of the semiconductor integrated circuit according to the modification to the third embodiment will now be described.

A test input signal SIN and a clock signal CLK are input to the test circuit T11 from outside. The test input signal SIN input to the test circuit T11 is latched in the test circuit T11 and output to each of the test circuits T1 to T3 in synchronization with the clock signal CLK serving as a test sync signal.

The test input signal SIN is then latched in a latch circuit provided in each of the test circuits T1 to T3 in synchronization with the clock signal CLK. The latched test input signal is decoded by a decoder and output to each of the storage circuits M1 to M3 to be tested.

After that, the data read out of each of the storage circuits M1 to M3 is supplied to the test circuits T1 to T3. The test circuits T1 to T3 each synchronize a signal, which is determined by logic between the data read out of each of the storage circuits M1 to M3 and a preset test output signal, with the clock signal CLK and supply it to the test circuits T4 to T6 in the next stage as an output signal.

The test input signal SIN is latched in the latch circuit provided in each of the test circuits T1 to T3 and simultaneously it is synchronized with the clock signal CLK and output to each of the test circuits T4 to T6 in the next stage. The test input signal SIN is synchronized with the clock signal CLK and latched in the latch circuit provided in each of the test circuits T4 to T6. The test input signal latched in each of the test circuits T4 to T6 is decoded by the decoder and output to each of the storage circuits M4 to M6 to be tested.

After that, the data read out of each of the storage circuits M4 to M6 is supplied to the test circuits T4 to T6. The test circuits T4 to T6 each synchronize a signal, which is determined by logic between the data read out of each of the storage circuits M4 to M6 and the test output signal output from each of the test circuits T1 to T3 in the preceding stage, with the clock signal CLK and supply it to the latch and multiplexer circuit LM11. The latch and multiplexer circuit LM11 selects one of the test output signals supplied from the test circuits T4 to T6 and outputs the selected one to the outside of the semiconductor integrated circuit 51 as an output signal OUT.

In the modification to the third embodiment described above, a plurality of test circuits each have a latch circuit for latching a test signal and are connected in parallel to the test signal lines. Another test circuit is provided in a stage subsequent to each of these test circuits, and one test circuit is provided in a stage precedent thereto. Thus, the test signal lines can easily be designed without considering a delay in test signal. Consequently, great constraints are not added to the arrangement of storage circuits to be tested. Furthermore, a plurality of storage circuits can be tested at the same time, so that the unit price of a test can be inhibited from increasing.

Figure 11:
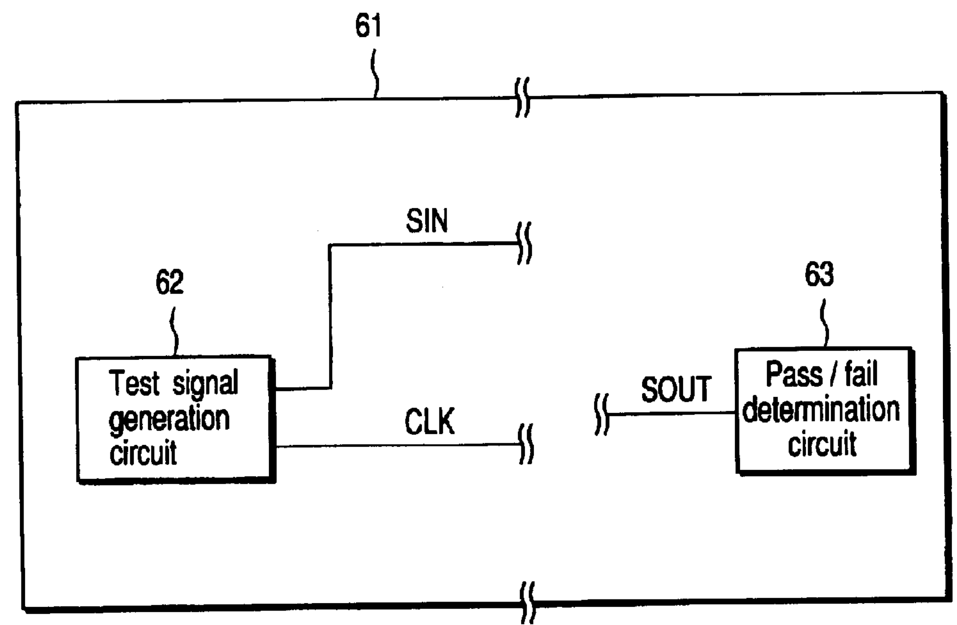
FIG. 11 is a block diagram showing an example of a semiconductor integrated circuit according to each of the foregoing embodiments and modifications, which has a test signal generation circuit and a pass/fail determination circuit.

In the foregoing embodiments and modifications, a test signal is supplied from the outside of a semiconductor integrated circuit. However, as shown in FIG. 11, a semiconductor integrated circuit 61 can include a test signal generation circuit 62 for generating a test signal containing a test input signal SIN and a clock signal CLK. Further, in the foregoing embodiments and modifications, a test output signal is supplied to the outside of a semiconductor integrated circuit. However, as shown in FIG. 11, the semiconductor integrated circuit 61 can include a pass/fail determination circuit 63 for determining whether a test output signal SOUT is an expected value.

The above embodiments can be executed alone or in appropriate combination. Each of the embodiments contains inventions in various stages. Various inventions can be extracted from appropriate combinations of a plurality of components to be disclosed in each of the embodiments.

According to the embodiments of the present invention, there can be provided a semiconductor integrated circuit that is capable of easily designing a design for test signal lines and preventing the unit price of a test from increasing as the test is conducted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:

first and second semiconductor storage circuits which store information;

a first test circuit which is supplied with test signals to test an operation of the first semiconductor storage circuit, the test signals including a test input signal, a test output signal, and a test sync signal used for synchronization with the operation of the first semiconductor storage circuit; and a second test circuit which is connected to a stage subsequent to the first test circuit, the second test circuit receiving the test signals from the first test circuit to test an operation of the second semiconductor storage circuit, wherein the first test circuit uses the test input signal as information to operate the first semiconductor storage circuit in synchronization with the test sync signal and supplies the test input signal to the second test circuit in the subsequent stage, and the first test circuit also synchronizes a signal, which is determined by performing a logical operation between an output of the first semiconductor storage circuit and the test output signal supplied thereto, with the test sync signal and supplies the signal to the second test circuit as a test output signal.

2. The semiconductor integrated circuit according to claim 1, wherein the first test circuit includes a delay circuit which delays the test sync signal and outputs a delayed signal as a test sync signal of the second test circuit in the subsequent stage.

3. The semiconductor integrated circuit according to claim 2, wherein the delay circuit controls a delay time of the test sync signal.

4. The semiconductor integrated circuit according to claim 3, wherein the first and second test circuits independently set the delay time of the test sync signal.

5. The semiconductor integrated circuit according to claim 4, wherein the first and second test circuits have each individual identification code, and the delay time is set by information including the identification code.

6. The semiconductor integrated circuit according to claim 1, wherein a power supply of the first and second test circuits is provided separately from that of the first and second semiconductor storage circuits.

7. The semiconductor integrated circuit according to claim 1, wherein the circuit includes an external input terminal and an external output terminal, and at least some of the test signals are input to the external input terminal from outside and output from the external output terminal.

8. The semiconductor integrated circuit according to claim 1, further comprising:

a test signal generation circuit which generates at least some of the test signals; and a pass/fail determination circuit which receives at least some of the test signals and determines whether the received test signals pass or fail.

9. The semiconductor integrated circuit according to claim 1, further comprising a third test circuit provided between the first test circuit and the second test circuit.

10. The semiconductor integrated circuit according to claim 7, further comprising a third test circuit provided in one of spaces between the external input terminal and the first test circuit and between the second test circuit and the external output terminal.

11. The semiconductor integrated circuit according to claim 8, further comprising a third test circuit provided in one of spaces between the test signal generation circuit and the first test circuit and between the second test circuit and the pass/fail determination circuit.

12. A semiconductor integrated circuit comprising:

a plurality of semiconductor storage circuits which store information; and a plurality of test circuits which are supplied with test signals to test an operation of each of the semiconductor storage circuits, the test signals including a test input signal, a test output signal, and a test sync signal used for synchronization with the operation of each of the semiconductor storage circuits, each of the test circuits using the test input signal as information to operate each of the semiconductor storage circuits in synchronization with the test sync signal and supplies the test input signal to the test circuit in a subsequent stage, and each of the test circuits also synchronizing a signal, which is determined by performing a logical operation between an output of each of the semiconductor storage circuits and the test output signal supplied thereto, with the test sync signal and supplying the signal to the test circuit in the subsequent stage as a test output signal.

13. The semiconductor integrated circuit according to claim 12, wherein each of the test circuits includes a delay circuit which delays the test sync signal and outputs a delayed signal as a test sync signal of the test circuit in the subsequent stage.

14. The semiconductor integrated circuit according to claim 13, wherein the delay circuit controls a delay time of the test sync signal.

15. The semiconductor integrated circuit according to claim 14, wherein the test circuits independently set the delay time of the test sync signal.

16. The semiconductor integrated circuit according to claim 15, wherein the test circuits have each individual identification code, and the delay time is set by information including the identification code.

17. The semiconductor integrated circuit according to claim 12, further comprising a circuit which synchronizes a signal, which is determined by a test output signal output from each of the test circuits to which the test signals are supplied, with the test sync signal and outputs the signal.

18. The semiconductor integrated circuit according to claim 17, wherein amounts of delay in the test signals coincide with one another when the amounts of delay are represented by frequencies of the test sync signal.

19. The semiconductor integrated circuit according to claim 12, wherein a power supply of the test circuits is provided separately from that of the semiconductor storage circuits.

20. The semiconductor integrated circuit according to claim 12, wherein the circuit includes an external input terminal and an external output terminal, and at least some of the test signals are input to the external input terminal from outside and output from the external output terminal.

21. The semiconductor integrated circuit according to claim 12, further comprising:

a test signal generation circuit which generates at least some of the test signals; and a pass/fail determination circuit which receives at lest some of the test signals and determines whether the received test signals pass or fail.

* * * * *